United States Patent
Lecordier

(10) Patent No.: US 10,316,406 B2
(45) Date of Patent: Jun. 11, 2019

(54) METHODS OF FORMING AN ALD-INHIBITING LAYER USING A SELF-ASSEMBLED MONOLAYER

(71) Applicant: Ultratech, Inc., San Jose, CA (US)

(72) Inventor: Laurent Lecordier, Somerville, MA (US)

(73) Assignee: Ultratech, Inc., San Jose, CA (US)

( * ) Notice: Subject to any disclaimer, the term of this patent is extended or adjusted under 35 U.S.C. 154(b) by 0 days.

(21) Appl. No.: 15/295,813

(22) Filed: Oct. 17, 2016

(65) Prior Publication Data

US 2017/0114451 A1 Apr. 27, 2017

Related U.S. Application Data

(60) Provisional application No. 62/244,467, filed on Oct. 21, 2015.

(51) Int. Cl.
| | |
|---|---|
| *C23C 16/02* | (2006.01) |
| *C22B 5/12* | (2006.01) |
| *C22B 15/00* | (2006.01) |
| *C23C 16/455* | (2006.01) |
| *C23C 16/56* | (2006.01) |

(Continued)

(52) U.S. Cl.
CPC .......... *C23C 16/0272* (2013.01); *C22B 5/12* (2013.01); *C22B 15/00* (2013.01); *C23C 16/04* (2013.01); *C23C 16/45525* (2013.01); *C23C 16/45527* (2013.01); *C23C 16/56* (2013.01); *H01L 21/0228* (2013.01)

(58) Field of Classification Search
None
See application file for complete search history.

(56) References Cited

U.S. PATENT DOCUMENTS

| | | |
|---|---|---|
| 8,084,087 B2 | 12/2011 | Bent et al. |
| 8,293,658 B2 | 10/2012 | Shero et al. |

(Continued)

FOREIGN PATENT DOCUMENTS

| | | |
|---|---|---|
| JP | H10161330 A | 6/1998 |
| JP | 2007270278 A | 10/2007 |

(Continued)

OTHER PUBLICATIONS

Farm, Elina et al. Passivation of copper surfaces for selective-area ALD using a thiol self-assembled monolayer. Semicond. Sci. Technolo. 27 (2012), pp. 1-5 (Year: 2012).*

(Continued)

*Primary Examiner* — David P Turocy
(74) *Attorney, Agent, or Firm* — Downs Rachlin Martin PLLC

(57) ABSTRACT

Methods of forming an ALD-inhibiting layer using a layer of SAM molecules include providing a metalized substrate having a metal M and an oxide layer of the metal M. A reduction gas that includes a metal Q is used to reduce the oxide layer of the metal M, leaving a layer of form of $M+MQ_yO_x$ atop the metal M. The SAM molecules are provided as a vapor and form an ALD-inhibiting SAM layer on the $M+MQ_yO_x$ layer. Methods of performing S-ALD using the ALD-inhibiting SAM layer are also disclosed.

22 Claims, 7 Drawing Sheets

(51) Int. Cl.
*H01L 21/02* (2006.01)
*C23C 16/04* (2006.01)

(56) References Cited

U.S. PATENT DOCUMENTS

| | | | |
|---|---|---|---|
| 2008/0032064 A1 | 2/2008 | Gordon et al. | |
| 2013/0207171 A1 | 8/2013 | Uno | |
| 2015/0217330 A1* | 8/2015 | Haukka | B05D 3/107 |
| | | | 427/343 |
| 2015/0294863 A1* | 10/2015 | Nemani | H01L 21/0228 |
| | | | 438/780 |
| 2015/0357234 A1* | 12/2015 | Rogalli | H01L 21/02178 |
| | | | 438/669 |

FOREIGN PATENT DOCUMENTS

| | | |
|---|---|---|
| JP | 2009158691 A | 7/2009 |
| JP | 2012049202 A | 3/2012 |
| WO | 2013141149 | 9/2013 |

OTHER PUBLICATIONS

Singapore Search Report dated May 4, 2017, in corresponding Singapore Patent Application No. 10201608841V filed on Oct. 21, 2016.

Amir Gharachorlou et al., "Trimethylaluminum and Oxygen Atomic Layer Deposition on Hydroxyl-Free CU," ACS Applied Materials & Interfaces, Jul. 9, 2015, vol. 7, pp. 16428-16439.

Elina Farm, "Selective-Area Atomic Layer Deposition," Nov. 24, 2011.

Stephen Ebbens et al., "Surface Micro-Patterning With Self-Assembled Monolayers Selectively Deposited on Copper Substrates by Ink-Jet Printing," Electronic Components and Technology Conference, 2007. Proceedings. 57th, Jun. 25, 2007, pp. 1362-1367.

Laurent Lecordier, "Novel Method to Achieve Area Selective ALD on Copper Metal vs. SiO2 Using Vapor-Phase Deposited SAMS," ALD 2016—Dublin, Ireland. Jul. 26, 2016.

* cited by examiner

METHODS OF FORMING AN ALD-INHIBITING LAYER USING A SELF-ASSEMBLED MONOLAYER

CROSS-REFERENCE TO RELATED APPLICATIONS

This Application claims the benefit of priority under 35 USC 119(e) of provisional patent application No. 62/244,467 filed on Oct. 21, 2015, and which is incorporated herein by reference.

FIELD

The present disclosure relates to atomic layer deposition (ALD), and in particular relates to methods of forming an ALD-inhibiting layer using a self-assembled monolayer (SAM).

The entire disclosure of any publication or patent document mentioned herein is incorporated by reference.

BACKGROUND

ALD is a method of depositing a thin film on a substrate in a very controlled manner. The deposition process is controlled using two or more chemicals in vapor form (i.e., "process gasses") and reacting them sequentially and in a self-limiting manner on the surface of the substrate such as a silicon wafer. The sequential process is repeated to build up the thin film layer by layer, wherein the layers are atomic scale.

ALD is used to form a wide variety of films, such as binary, ternary and quaternary oxides for advanced gate and capacitor dielectrics, as well as metal-based compounds for interconnect barriers and capacitor electrodes.

The typical ALD process introduces a first process gas into the single process chamber. The substrate sits in this environment for a short period of time to expose the surface to the first process gas. Once the surface of the substrate is saturated with the first process gas, the first process gas is pumped out of the chamber. Then an inert or purge gas is flowed through the chamber. Then a second process gas is introduced into the chamber. The second process gas reacts with the surface of the substrate that was saturated by the first process gas. The purpose of the inert or purge gas flowing through the chamber before the second process gas is flowed into the chamber is to ensure that all of the original unreacted first process gas is removed. The second process gas reacts with the surface of the substrate that was saturated with the first process gas.

Once this second reaction process is completed, the second process gas is removed and the chamber is again purged with an inert or purge gas. Then, the first process gas is introduced into the chamber and the entire reaction sequence is repeated until an ALD film of a desired thickness is obtained.

In one type of ALD process, the ALD film covers the entire surface of the substrate. However, when forming a semiconductor device, it is typically preferred to form the ALD film in select areas of the substrate in the process of defining a 3D semiconductor device structure. While this can be done using physical masking methods, such as photoresist-type masking, such masking methods are process-intensive and time consuming.

SUMMARY

The methods disclosed herein can be used to form an ALD-inhibiting layer on a layer of a metal M that includes a native metal oxide ($MO_x$). The method includes performing in-situ reduction of the native metal oxide $MO_X$ using a reduction gas that contains a metal Q to form a "metal+metal oxide" layer of the form $M+MQ_yO_x$. This is followed by exposing the $M+MQ_yO_x$ layer to SAM molecules in the vapor phase to form a SAM layer on the $M+MQ_yO_x$ layer. An example SAM molecule is thiol, which is an organosulfur compound that contains a carbon-bonded sulfhydryl group.

An aspect of the disclosure is a method of forming an ALD-inhibiting layer on a metal M covered with an oxide layer of the metal M (hereinafter called "metal-oxide layer"). The method includes a) reducing the metal-oxide layer by exposing the metal-oxide layer to a reduction gas that includes a metal Q to form a $M+MQ_xO_y$ layer on the metal M; and b) exposing the $M+MQ_xO_y$ layer to self-assembled-monolayer (hereinafter called "SAM") molecules in a vapor phase, wherein the SAM molecules form on the $M+MQ_xO_y$ layer a SAM layer that is ALD inhibiting.

Another aspect of the disclosure is the method described above, wherein the metal M is Cu, Ni, Fe or Co, and the metal Q is Al, Hf, Zr, Si, Ti or Zn.

Another aspect of the disclosure is the method described above, wherein the SAM molecules are thiol molecules.

Another aspect of the disclosure is the method described above, wherein the metal M is copper, the metal-oxide layer is made from copper oxide, the reduction gas comprises trimethylaluminum (TMA), the SAM molecules are thiol molecules, and the $M+MQ_xO_y$ layer is $Cu+CuAlO_2$ layer.

Another aspect of the disclosure is the method described above, wherein act a) is carried out at a temperature of between 120° C. and 250° C.

Another aspect of the disclosure is the method described above, wherein acts a) and b) are carried out in a vacuum condition less than 1 Torr.

Another aspect of the disclosure is the method described above, wherein the metal-oxide layer has a thickness in the range from 1 nm to 5 nm.

Another aspect of the disclosure is the method described above, wherein the ALD-inhibiting layer substantially inhibits the formation of an ALD film thereon for at least 100 ALD cycles.

Another aspect of the disclosure is the method described above, wherein the ALD-inhibiting layer substantially inhibits the formation of an ALD film thereon for at least 150 ALD cycles.

Another aspect of the disclosure is the method described above, the method further includes forming the metal M as a patterned metal layer on a semiconductor substrate.

Another aspect of the disclosure is the method described above, the metal M is formed as a pattern on a dielectric layer of a semiconductor substrate. And the method further includes performing selective-area ALD by performing an ALD process on the dielectric layer and the SAM layer that covers the metal M, thereby forming an ALD film on the dielectric layer but not the SAM layer.

Another aspect of the disclosure is the method described above, wherein the dielectric layer is an oxide layer.

Another aspect of the disclosure is the method described above, the method further includes removing the SAM layer.

Another aspect of the disclosure is the method described above, wherein act a) is performed in less than 720 seconds.

The methods disclosed herein enable performing selective-area ALD (S-ALD) by selective formation of the ALD-inhibiting layer, e.g., on metal electrodes of a semiconductor device. The methods reduce the number of processing steps needed during the fabrication of integrated circuits as it obviates the need for a number of lithographic, etch and deposition steps typically associated with conventional S-ALD methods.

An aspect of the disclosure is a method of performing selective-area atomic layer deposition (hereinafter called "S-ALD"). The method includes a) defining a layer of metal M (hereinafter called "metal layer") on a dielectric layer supported by a semiconductor substrate, wherein the metal layer defines a pattern, and wherein the metal layer is covered by a layer of oxide of the metal M (hereinafter called "metal-oxide layer"); b) reducing the metal-oxide layer by exposing the metal-oxide layer to a reduction gas that includes a metal Q to form a $M+MQ_xO_y$ layer on the metal layer; c) exposing the $M+MQ_xO_y$ layer and the dielectric layer to self-assembled-monolayer (SAM) molecules in a vapor phase, wherein the SAM molecules form on the $M+MQ_xO_y$ layer a SAM layer to define an ALD-inhibiting layer, and wherein no SAM layer is formed on the dielectric layer; and d) performing an ALD process to deposit an ALD film, wherein the ALD film forms on the dielectric layer but not on the SAM layer.

Another aspect of the disclosure is the method described above, wherein the metal M is Cu, Ni, Fe or Co, and the metal Q is Al, Hf, Zr, Si, Ti or Zn.

Another aspect of the disclosure is the method described above, the method further includes an act e) of removing the SAM layer.

Another aspect of the disclosure is the method described above, wherein act b) is performed within 720 seconds.

Another aspect of the disclosure is the method described above, wherein the SAM molecules consist of thiol molecules.

Another aspect of the disclosure is the method described above, wherein the dielectric layer comprises an $SiO_2$ layer.

Another aspect of the disclosure is the method described above, wherein the metal M is copper, the metal-oxide layer is made from copper oxide, the reduction gas comprises trimethylaluminum (TMA), the SAM molecules are thiol molecules, and the $M+MQ_xO_y$ layer is $Cu+CuAlO_2$ Layer.

Another aspect of the disclosure is the method described above, wherein the SAM layer substantially inhibits the formation of an ALD film thereon for at least 100 ALD cycles.

Another aspect of the disclosure is the method described above, wherein the SAM layer substantially inhibits the formation of an ALD film thereon for at least 150 ALD cycles.

Another aspect of the disclosure is the method described above, wherein act b) is carried out at a temperature of between 120° C. and 250° C.

Another aspect of the disclosure is the method described above, wherein acts b) and c) are carried out in a vacuum condition less than 1 Torr.

Another aspect of the disclosure is the method described above, wherein the metal-oxide layer has a thickness in the range from 1 nm to 5 nm.

Another aspect of the disclosure is the method described above, wherein the reduction gas comprises trimethylaluminum (TMA) or alkyl amide.

Another aspect of the disclosure is the method described above, wherein acts b), c) and d) are carried out in a single ALD chamber.

Additional features and advantages are set forth in the Detailed Description that follows, and in part will be readily apparent to those skilled in the art from the description or recognized by practicing the embodiments as described in the written description and claims hereof, as well as the appended drawings. It is to be understood that both the foregoing general description and the following Detailed Description are merely exemplary, and are intended to provide an overview or framework to understand the nature and character of the claims.

BRIEF DESCRIPTION OF THE DRAWINGS

The accompanying drawings are included to provide a further understanding, and are incorporated in and constitute a part of this specification. The drawings illustrate one or more embodiment(s), and together with the Detailed Description serve to explain principles and operation of the various embodiments. As such, the disclosure will become more fully understood from the following Detailed Description, taken in conjunction with the accompanying Figures, in which.

DETAILED DESCRIPTION

Reference is now made in detail to various embodiments of the disclosure, examples of which are illustrated in the accompanying drawings. Whenever possible, the same or like reference numbers and symbols are used throughout the drawings to refer to the same or like parts. The drawings are not necessarily to scale, and one skilled in the art will recognize where the drawings have been simplified to illustrate the key aspects of the disclosure.

The claims as set forth below are incorporated into and constitute part of this detailed description.

Cartesian coordinates are shown in some of the Figures for the sake of reference and are not intended to be limiting as to direction or orientation.

In the discussion below, a "SAM layer" means a layer of self-assembled molecules, i.e., a self-assembled monolayer.

Also in the discussion below, the term "SAM molecule" means a molecule that is capable of forming a SAM layer with other SAM molecules. An example of a SAM molecule discussed below is 1-octadecanethiol.

Example of the methods of performing selective-area atomic-layer deposition (S-ALD) are now described in connection with the cross-sectional views of FIGS. 1 through 4. In a first step, a substrate 10 with an upper surface 12 is provided. In an example, the substrate 10 is a Si wafer. The upper surface 12 of substrate 10 is covered with a metal layer 20, which is covered with a layer 22 of a native metal oxide (hereinafter called "metal-oxide layer"). In an example, the metal of metal layer 20 is copper (Cu) while the native metal oxide in the metal-oxide layer 22 is copper oxide ($Cu_2O$). At this point, the substrate 10 with the metal layer 20 and metal-oxide layer 22 constitutes a metalized substrate 10M. The metal of metal layer 20 is referred to as "M" herein. The thickness of the metal-oxide layer 22 can be very thin, e.g., in the range of 1 nm to 5 nm thick. Examples of metal M are copper, nickel, iron and cobalt.

Figure 1:
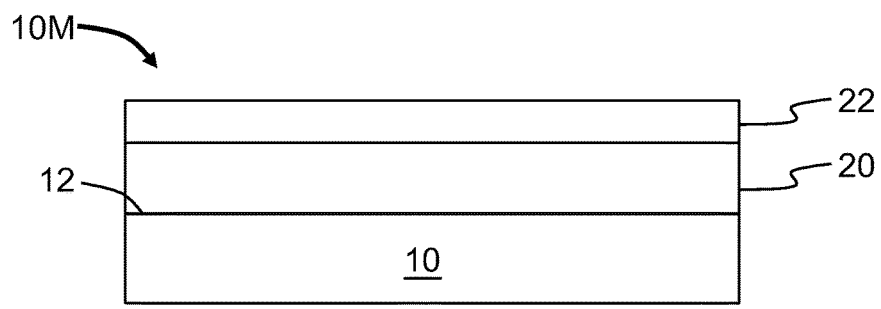
FIGS. 1 through 4 are cross-sectional views of an example metalized substrate that show different steps of the method of forming an ALD-inhibiting SAM layer on the metalized substrate.
Figure 2:
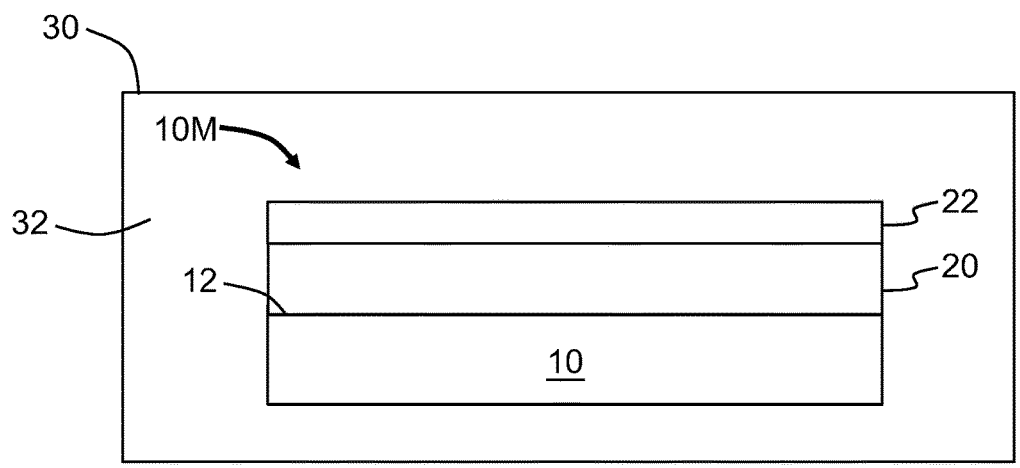

With reference to FIG. 2, in a second step, the metalized substrate 10M of FIG. 1 is placed in an interior 32 of an ALD chamber 30 of an ALD reactor system. The interior 32 of the ALD chamber 30 is then brought to a vacuum condition (e.g., a pressure less than 1 Torr) and the metalized substrate 10M is heated to a temperature of 120° C. or above, e.g., to 150° C. or 170° C. or up to 250° C. The vacuum condition limits the amount of residual oxygen that could lead to further amounts of the metal oxide being formed. The increased temperature facilitates the chemical reactions in the subsequent steps as described below.

Figure 3:
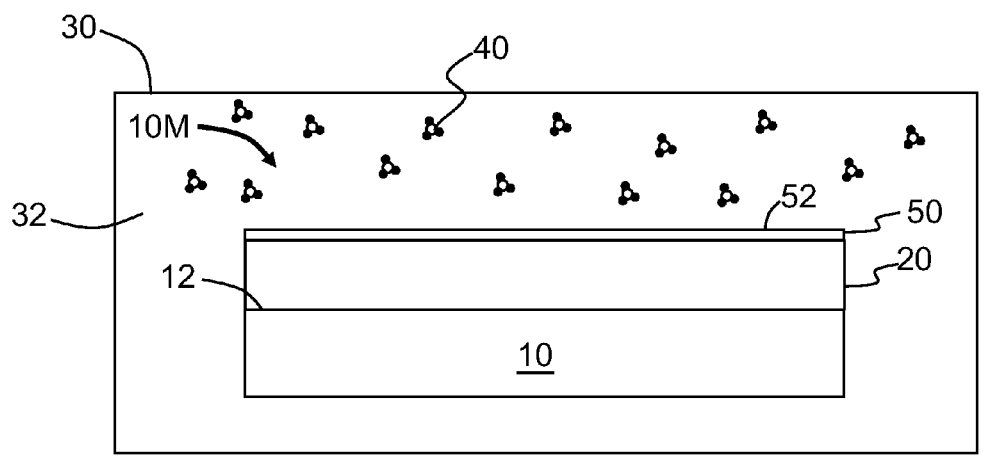

With reference to FIG. 3, in a third step the metalized wafer 10M and in particular the metal-oxide layer 22 thereon is exposed to a reduction gas 40 that contains a metal Q. In an example, the reduction gas 40 is or includes trimethylaluminum (TMA), wherein the metal Q is aluminum. In another example, the reduction gas 40 is or includes metal alkylamide, wherein the metal Q is Hf, Zr, Si or Ti. Also in an example, other alkyl metal organic precursors such as diethylzinc can be used as the reduction gas 40.

The reduction gas 40 reduces the metal-oxide layer 22, thereby removing the metal-oxide layer 22. The exposure length and quantity of reduction gas 40 needed are a function of the nature of the native metal-oxide to be removed, its thickness, the temperature of metalized substrate 10M and the type of reduction gas 40 used. The result of this oxidation-reduction step is a "metal+metal oxide" layer 50 of the form $M+MQ_yO_x$ formed atop the metal layer 20. The metal+metal oxide layer 50 has a surface 52. In an example where the metal Q of reduction gas 40 is aluminum and where the metal M of metal layer 20 is copper, the metal+metal oxide layer 50 can have the form $Cu+CuAlO_2$.

Experiments were performed wherein the metalized substrate 10M was formed using a metal layer 20 with M=copper, and metal-oxide layer 22 of copper oxide having a thickness of 1 nm to 3 nm. The copper-based metalized substrate 10M was heated to 150° C. to 170° C. under vacuum (0.1 Torr) and the native copper oxide layer 22 was removed with 10 to 20 consecutive pulses of TMA as the reduction gas 40, with the TMA pulse being 0.015 s long and 2 s to 60 s apart. The reduction of the copper oxide layer 22 was observed in situ and its thickness was gradually reduced after 10 TMA exposures to a thickness of about 1 nm. It is also noted that the apparent thickness decrease caused by the copper reduction was also observed with pulses of the reduction gases 40 in the form of TDMAHf (where metal Q=Hf) and TDMAZr (where Q=Zr), which are are reactant gases commonly used for the deposition of $HfO_2$ and $ZrO_2$ by ALD.

The metal+metal oxide layer 50 from this copper-based example includes the metal Cu and the metal-aluminum oxide had the aforementioned form $CuAlO_2$.

Figure 5:
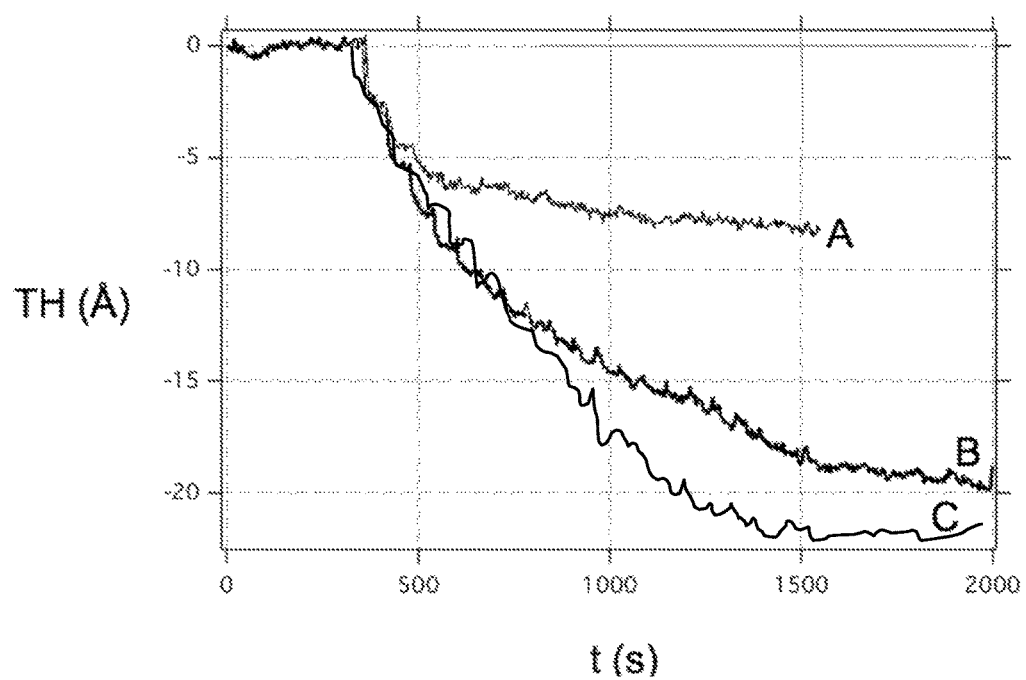
FIG. 5 is a plot of the thickness TH (Å) vs time t (s) for a $Cu_2O$ layer as observed by an in situ spectroscopic ellipsometer over 20 consecutive pulses of reduction gas with an inter-pulse interval of 60 s, wherein the reduction gas was in the form of TMA (curve A), TDMAHf (curve B) and TDMAZr (curve C), illustrating how the given reduction gas reduces the thickness of the $Cu_2O$ layer.

FIG. 5 is a plot of the thickness (Å) vs time (s) for a copper oxide layer 22 as observed by an in situ spectroscopic ellipsometer over 20 consecutive pulses with inter-pulse interval of 60 s of a reduction gas 40 in the form of TMA (curve A), TDMAHf (curve B) and TDMAZr (curve C), illustrating how the given reduction gas 40 reduces the thickness of the $Cu_2O$ layer 22.

Figure 4:
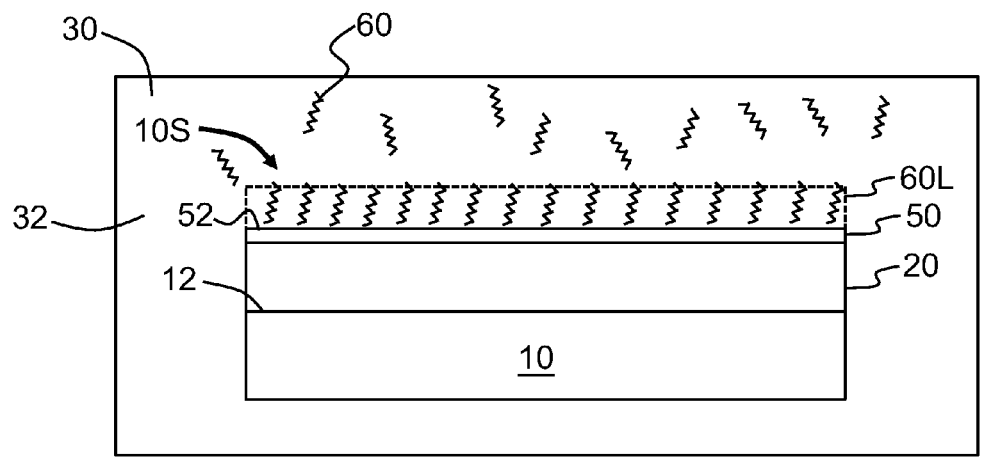

With reference to FIG. 4, in a fourth step the metal+metal oxide layer 50 is immediately exposed to a SAM vapor that includes SAM molecules 60. An example SAM vapor is thiol, e.g., 1-octadecanethiol. The SAM molecules 60 can efficiently deposit on the oxide-free surface 52 of the metal+ metal oxide layer 50 to provide a highly packed self-assembled monolayer ("SAM layer") 60L defined by the SAM molecules 60 (e.g., thiol molecules). At this point in the process, the metalized substrate 10M is referred to as a SAM-coated substrate ("SAMS") 10S.

In an example, the oxide-reduction step and the SAMS deposition step can each be performed in the same ALD chamber 30, though the reduction step could be performed in a different ALD chamber 30, preferably the reaction surface being not exposed to air (e.g., using a sealed transfer box).

The SAM vapor exposure step can vary from a few seconds to several hours, though in experiments a 600 s exposure time proved sufficient to achieve a good SAM layer 60L of thiol molecules 60 on a copper-based metalized substrate 10M.

The SAM layer 60L of packed SAM molecules 60, enabled by the reduction pretreatment of metalized substrate 10M, constitutes an ALD-inhibiting layer, i.e., an efficient barrier layer to the deposition of an ALD film. The SAM layer 60L delays the nucleation and growth of an ALD film for a relatively large number (e.g., N>100) of ALD cycles.

In an example of the method, the in-situ reduction step can be performed in two steps, e.g., the ALD formation of a metal-oxide layer 22 (e.g., 10-30 nm) followed by in-situ reduction of the metal-oxide layer 22 to obtain the metal+ metal oxide layer 50 using the Q-containing reduction gas 40.

Experiments

Experiments were also conducted on the substrates 10 metalized with a copper layer 20 using physical vapor deposition (PVD), with a top metal-oxide layer 22 of native copper oxide having a thickness of between 1 nm and 3 nm. The metalized substrates 10M were loaded as-is, i.e., no pre-cleaning, in an ALD reactor. The particular ALD reactor used was the Ultratech Cambridge Nanotech Savannah™ reactor. The metalized substrates 10M were rapidly brought under vacuum (0.1 Torr) and heated at temperatures of between 150° C. to 170° C.

Consecutive pulses of TMA were introduced in the ALD chamber 30 and the reduction of native copper oxide was observed in real-time via in-situ spectroscopic ellipsometry. It was found that 10 to 20 TMA pulses of 0.015 s duration were sufficient to complete the reduction of the native copper oxide layer 22. Pulses were 60 s apart in the example of FIG. 5, but the pulses can have other periods, e.g., 5 seconds apart or less. Pulses could also be replaced with a continuous flow of TMA or other reduction gas 40. Thus, in an example, the reduction of metal-oxide layer 22 was performed in 600 seconds (s), i.e., in 10 minutes. In another example, the reduction of metal-oxide layer 22 can be performed in 720 s, i.e., in 12 minutes. Reductions in less than 2 minutes were also demonstrated.

The reduced metal surface was then exposed under vacuum to 1-octadecanethiol vapor for 600 s to obtain a dense SAM layer 60L on top of the reduced copper. The quality of the SAM layer 60L, i.e., the packing density, was characterized in-situ by monitoring the nucleation inhibiting during the deposition of $HfN_x$ metal nitride via ALD on top of the copper/SAMS substrate. The growth of the metal nitride was successfully delayed to up to 150 ALD cycles for the thiol-coated copper sample vs 0 ALD cycles for the bare copper/copper oxide, and 10 ALD cycles for copper/copper oxide with thiol but no TMA-pretreatment. No significant inhibiting was also observed on a $SiO_2$ surface exposed to the thiol treatment. This in-situ reduction method can therefore be implemented to promote selective-area ALD on copper surfaces.

In-situ monitoring by spectroscopic ellipsometry of copper/copper oxide surfaces exposed to other chemistries commonly used in ALD such as metal alkyl amides, i.e., tetrakis(dimethylamino) hafnium (TDMAHf) or tetrakis(dimethylamino) zirconium (TDMAZr), indicate that copper oxide can also be reduced with these precursors. Other reduction gases 40 that can be effectively employed include titanium alkyl amides, silicon alkyl amides and Diethyl zinc.

Figure 6:
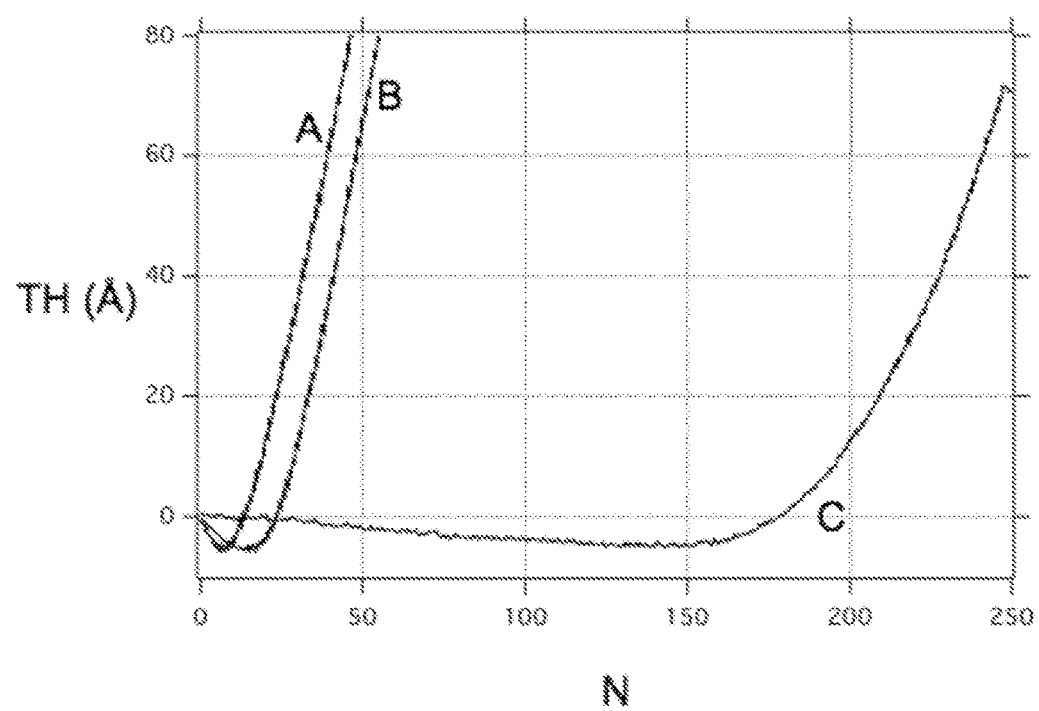
FIG. 6 is a plot of the measured thickness TH (Å) of an ALD film $HfN_x$ vs the number N of ALD cycles, for the ALD film deposited on an as-is copper substrate with copper native oxide $Cu_2O$ (Å), on copper with thiol but no reduction pretreatment (curve B), and on copper with TMA reduction pretreatment and using thiol SAM molecules (curve C), with the latter showing an ALD-inhibiting property wherein the ALD film growth was effectively delayed by more than 150 ALD cycles.
Figure 7:
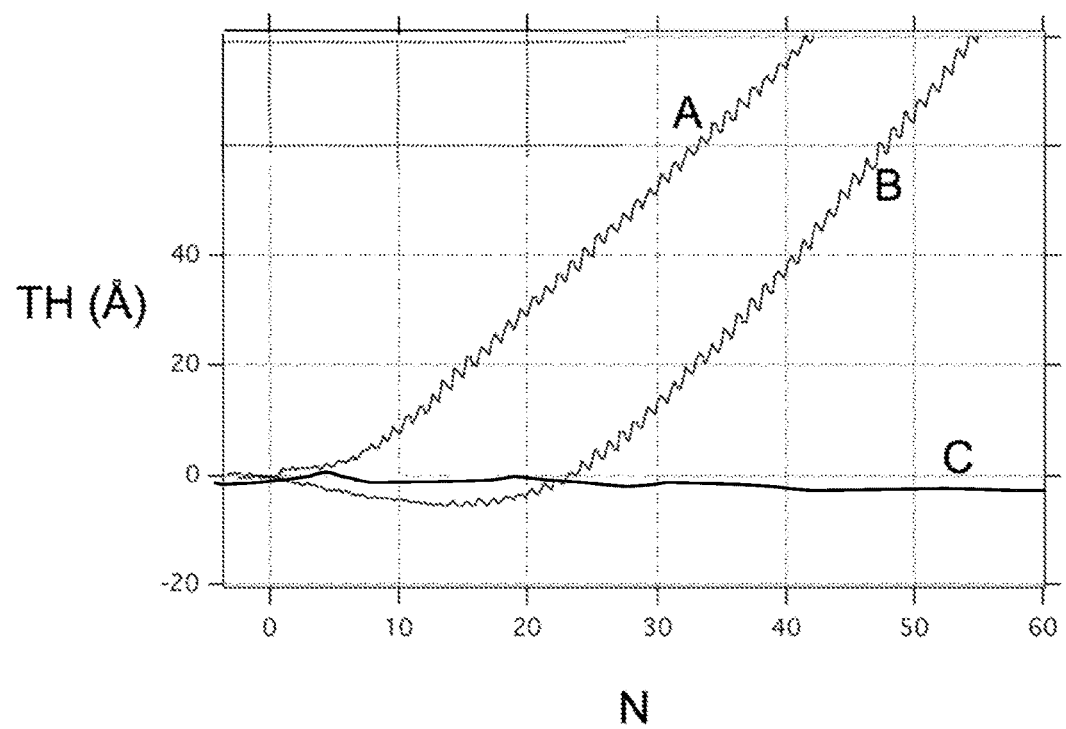
FIG. 7 is a plot of the measured thickness TH (Å) of an ALD film $HfN_x$ versus the number N of ALD cycles, showing the growth of the ALD film on an $SiO_2$+SAM layer (Curve A), unreduced copper+SAM layer (curve B) and reduced copper+SAM layer (Curve C), illustrating how the ALD-inhibiting SAM layer is not nearly as inhibiting on $SiO_2$ (about 5 ALD cycles) versus the reduced copper (greater than 150 ALD cycles)

FIG. 6 is a plot of the measured thickness (Å) of an ALD film $HfN_x$ vs the number N of ALD cycles, for the ALD film deposited on an as-is copper substrate with copper native oxide (curve A), on copper with a thiol SAM layer 60L but no reduction pretreatment (curve B) and on copper with TMA-pretreated thiol (curve C), with the latter curve showing an ALD-inhibiting property wherein the growth of ALD film was effectively delayed by N>150 ALD cycles. The data of FIG. 6 indicate that reduction pre-treatment of the metal-oxide layer 22 is required to remove the metal-oxide layer 22 to enable the formation of the ALD-inhibiting SAM layer 60L In an example, the SAM-coated substrate 10S was subjected to an ALD process in an attempt to grow an ALD film of $HfN_x$ on the SAM layer 60L using TDMAHf and ammonia ($NH_3$) deposited at a temperature of 170° C. FIG. 7 is a plot of the measured thickness (Å) of the ALD film $HfN_x$ versus the number N of ALD cycles. The plot shows the growth of the ALD film on an $SiO_2$+SAM layer (curve A), on a unreduced copper+SAM layer (curve B) and reduced copper+SAM layer (curve C). The three curves illustrate how the ALD-inhibiting SAM layer 60L is not nearly as inhibiting on $SiO_2$ (growth occurs starting at N=5 ALD cycles) versus the reduced copper (growth occurs only for N>150 ALD cycles). It was also observed that the TMA pretreatment and the subsequent thiol SAM deposition is selective, as an effective thiol SAM layer 60L was deposited on the $Cu+CuAlO_2$ layer 50 but not on $SiO_2$ when using the same method. This indicates that there is no significant nucleation inhibiting during the ALD process on the pretreated silicon dioxide surfaces.

S-ALD Method Example

An aspect of the disclosure includes performing S-ALD as part of a process of forming semiconductor structure in the fabrication of a semiconductor device.

Figure 8A:
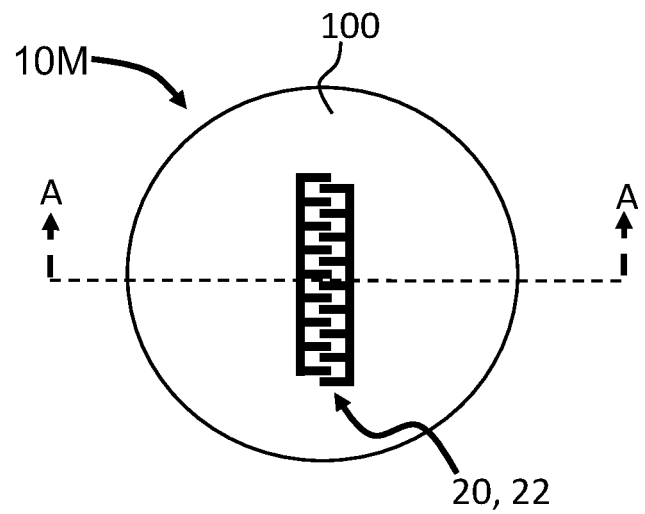
FIG. 8A is a top-down view and FIG. 8B is a cross-sectional view along the line A-A of FIG. 8A, showing an example metalized substrate having an $SiO_2$ layer with a patterned metal layer formed thereon.
Figure 8B:
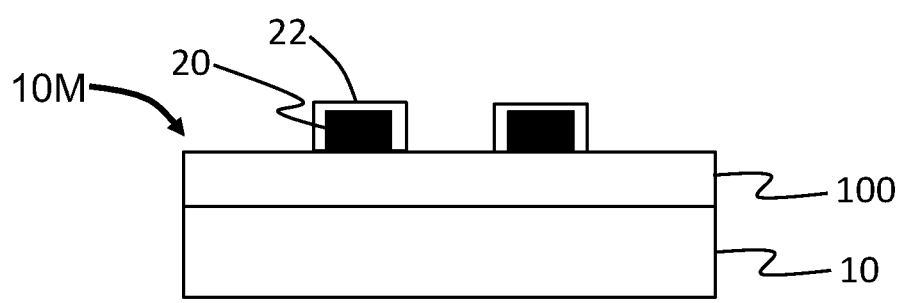

FIG. 8A is a top-down view and FIG. 8B is a cross-sectional view (along the line A-A) of an example metalized substrate 10M that includes a dielectric layer 100 (e.g., an oxide such as $SiO_2$ film) on the upper surface 12 of substrate 10 and a metal layer 20 on the oxide film. The metal layer 20 is patterned and defines an electrode. The metal pattern 20 includes metal-oxide layer 22. The oxide film can be any of the oxides used in semiconductor processing, with $SiO_2$ being one example oxide.

Figure 9A:
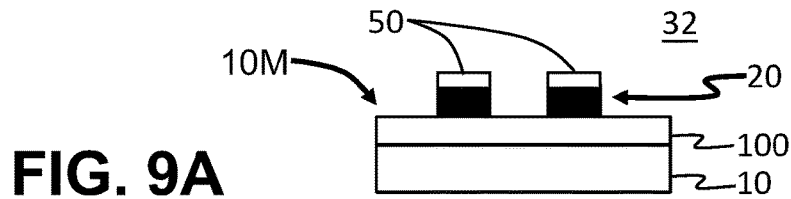
FIGS. 9A through 9D are cross-sectional views similar to FIG. 8B illustrating example method steps for performing S-ALD on the metalized substrate of FIGS. 8A and 8B, wherein ALD-inhibiting layer is formed on the patterned metal layer sections so that the ALD film can be formed on the $SiO_2$ layer and not on the patterned metal layer.

FIGS. 9A through 9D are cross-sectional views of metalized substrate 10M taken along the line A-A as the substrate 10 is subjected to the method described above of providing an ALD-inhibiting SAM layer 60L. With reference to FIG. 9A, the metal-oxide layer 22 of patterned metal layer 20 is subjected to the above-described reduction process that forms metal+metal oxide layer 50 on the patterned metal layer 20. As noted above, the metal+metal oxide layer 50 is receptive to the SAM molecules 60.

Figure 9B:
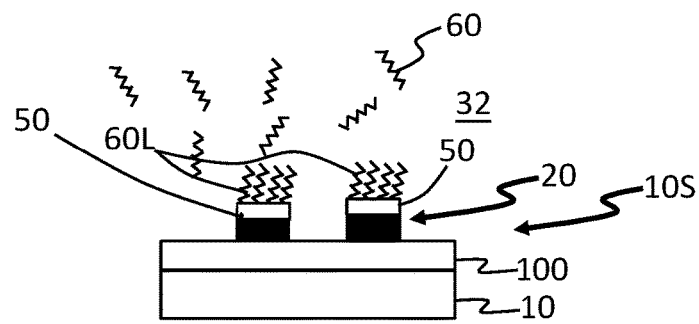

With reference to FIG. 9B, the SAM molecules 60 are then introduced into the interior 32 of the ALD chamber 30 to form ALD-inhibiting SAM layer 60L atop the section of metal+metal oxide layer 50 defined by patterned metal layer 20. The SAM molecules 60 do not self-assemble on the dielectric layer 100 so that this layer 100 remains available for ALD coating.

Figure 9C:
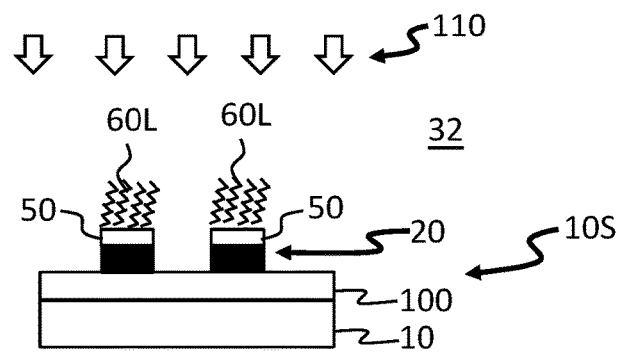
Figure 9D:
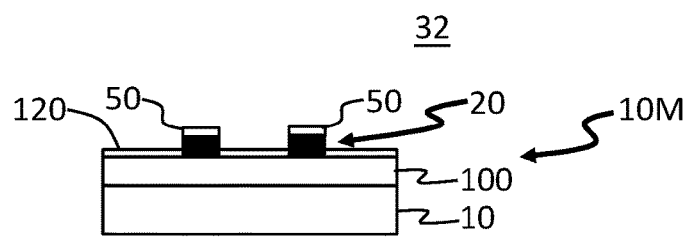

With reference to FIGS. 9C and 9C, an ALD process 110 is carried out that deposits an ALD film 120 on the dielectric layer 100 but not on the sections of ALD-inhibiting SAM layer 60L. Once the ALD process is completed and the ALD film 120 is formed on $SiO_2$ layer 100, the ALD-inhibiting SAM layer 60L is removed using a mild etchant, leaving behind the metal electrodes with the metal+metal oxide layer 50 and the ALD-coated dielectric layer 100.

It will be apparent to those skilled in the art that various modifications to the preferred embodiments of the disclosure as described herein can be made without departing from the spirit or scope of the disclosure as defined in the appended claims. Thus, the disclosure covers the modifications and variations provided they come within the scope of the appended claims and the equivalents thereto.

What is claimed is:

1. A method of forming an ALD-inhibiting layer on a metal M covered with an oxide layer of the metal M ("metal-oxide layer"), comprising:
   a) reducing the metal-oxide layer by exposing the metal-oxide layer to a reduction gas that includes a metal Q to form a $M+MQ_xO_y$ layer on the metal M, wherein x and y are non-zero positive integers; and
   b) exposing the $M+MQ_xO_y$ layer to self-assembled-monolayer ("SAM") molecules in a vapor phase, wherein the SAM molecules form on the $M+MQ_xO_y$ layer a SAM layer that is ALD inhibiting;
   wherein:
      the metal M is copper;
      the metal-oxide layer is made from copper oxide;
      the reduction gas comprises trimethylaluminum (TMA);
      the SAM molecules are thiol molecules; and
      the $M+MQ_xO_y$ layer is $Cu+CuAlO_2$ layer.

2. The method according to claim 1, wherein act a) is carried out at a temperature of between 120° C. and 250° C.

3. The method according to claim 1, wherein acts a) and b) are carried out in a vacuum condition less than 1 Torr.

4. The method according to claim 1, wherein the metal-oxide layer has a thickness in the range from 1 nm to 5 nm.

5. The method according to claim 1, wherein the ALD-inhibiting layer substantially inhibits the formation of an ALD film thereon for at least 100 ALD cycles.

6. The method according to claim 5, wherein the ALD-inhibiting layer substantially inhibits the formation of an ALD film thereon for at least 150 ALD cycles.

7. The method according to claim 1, further comprising forming the metal M as a patterned metal layer on a semiconductor substrate.

8. The method according to claim 1, wherein the metal M is formed as a pattern on a dielectric layer of a semiconductor substrate, and further comprising performing selective-area ALD by:
performing an ALD process on the dielectric layer and the SAM layer that covers the metal M, thereby forming an ALD film on the dielectric layer but not the SAM layer.

9. The method according to claim 8, wherein the dielectric layer is an oxide layer.

10. The method according to claim 8, further comprising removing the SAM layer.

11. The method according to claim 1, wherein act a) is performed in less than 720 seconds.

12. A method of performing selective-area atomic layer deposition ("S-ALD"), comprising:
a) defining a layer of metal M ("metal layer") on a dielectric layer supported by a semiconductor substrate, wherein the metal layer defines a pattern, and wherein the metal layer is covered by a layer of oxide of the metal M ("metal-oxide layer");
b) reducing the metal-oxide layer by exposing the metal-oxide layer to a reduction gas that includes a metal Q to form a $M+MQ_xO_y$ layer on the metal layer;
c) exposing the $M+MQ_xO_y$ layer and the dielectric layer to self-assembled-monolayer (SAM) molecules in a vapor phase, wherein the SAM molecules form on the $M+MQ_xO_y$ layer a SAM layer to define an ALD-inhibiting layer, and wherein no SAM layer is formed on the dielectric layer; and
d) performing an ALD process to deposit an ALD film, wherein the ALD film forms on the dielectric layer but not on the SAM layer;
wherein:
the metal M is copper;
the metal-oxide layer is made from copper oxide;
the reduction gas comprises trimethylaluminum (TMA);
the SAM molecules are thiol molecules; and
the $M+MQ_xO_y$ layer is $Cu+CuAlO_2$ layer.

13. The method according to claim 12, further comprising an act e) of removing the SAM layer.

14. The method according to claim 12, wherein act b) is performed within 720 seconds.

15. The method according to claim 12, wherein the SAM molecules consist of thiol molecules.

16. The method according to claim 12, wherein the dielectric layer comprises an $SiO_2$ layer.

17. The method according to claim 12, wherein the SAM layer substantially inhibits the formation of an ALD film thereon for at least 100 ALD cycles.

18. The method according to claim 17, wherein the SAM layer substantially inhibits the formation of an ALD film thereon for at least 150 ALD cycles.

19. The method according to claim 12, wherein act b) is carried out at a temperature of between 120° C. and 250° C.

20. The method according to claim 12, wherein acts b) and c) are carried out in a vacuum condition less than 1 Torr.

21. The method according to claim 12, wherein the metal-oxide layer has a thickness in the range from 1 nm to 5 nm.

22. The method according to claim 12, wherein acts b), c) and d) are carried out in a single ALD chamber.

* * * * *